(12) United States Patent
Ohta et al.

(10) Patent No.: US 12,356,863 B2
(45) Date of Patent: Jul. 8, 2025

(54) PIEZOELECTRIC ELEMENT

(71) Applicant: TDK CORPORATION, Tokyo (JP)

(72) Inventors: Yoshiki Ohta, Tokyo (JP); Jun Sugawara, Tokyo (JP); Kenichiro Andou, Tokyo (JP); Nana Sato, Tokyo (JP); Akihiro Takeda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 876 days.

(21) Appl. No.: 17/615,574

(22) PCT Filed: May 25, 2020

(86) PCT No.: PCT/JP2020/020588
§ 371 (c)(1),
(2) Date: Nov. 30, 2021

(87) PCT Pub. No.: WO2020/250657
PCT Pub. Date: Dec. 17, 2020

(65) Prior Publication Data
US 2022/0352454 A1 Nov. 3, 2022

(30) Foreign Application Priority Data
Jun. 14, 2019 (JP) .............................. JP2019-110979

(51) Int. Cl.
*H01L 41/047* (2006.01)
*H10N 30/30* (2023.01)
(Continued)

(52) U.S. Cl.
CPC ........... *H10N 30/87* (2023.02); *H10N 30/302* (2023.02); *H10N 30/045* (2023.02)

(58) Field of Classification Search
CPC ...................................................... H10N 30/87
See application file for complete search history.

(56) References Cited

U.S. PATENT DOCUMENTS

| 2008/0079331 A1* | 4/2008 | Butler | ............... B06B 1/0603 |
| | | | 310/331 |
| 2010/0217160 A1* | 8/2010 | Saguchi | ............... A61N 7/00 |
| | | | 601/2 |

(Continued)

FOREIGN PATENT DOCUMENTS

| JP | S59-000955 U | 1/1984 |
| JP | H11-317999 A | 11/1999 |

(Continued)

OTHER PUBLICATIONS

English Translation of JP H11317999 (Year: 1999).*

(Continued)

*Primary Examiner* — Bryan P Gordon
(74) *Attorney, Agent, or Firm* — Oliff PLC (57) ABSTRACT

A piezoelectric element includes a piezoelectric body including a piezoelectric material, and a first electrode and a second electrode provided on the piezoelectric body. The piezoelectric body includes a base and a plurality of drivers. The base includes a first main surface and a second main surface opposing each other. The plurality of drivers is arranged on the first main surface in such a way as to be separate from each other. Each of the plurality of drivers includes a third main surface contacting the first main surface and a fourth main surface opposing the third main surface. The base includes a plurality of first regions in which the plurality of drivers is provided and a second region provided between the first regions adjacent to each other. The base is curved.

11 Claims, 5 Drawing Sheets

(51) Int. Cl.
*H10N 30/87* (2023.01)
*H10N 30/045* (2023.01)

(56) References Cited

U.S. PATENT DOCUMENTS

2010/0239133 A1* 9/2010 Schmitt .............. G06V 40/1306
310/323.21
2020/0241642 A1* 7/2020 Oh .......................... G06F 3/016

FOREIGN PATENT DOCUMENTS

JP  2003-348681 A  12/2003
WO  2006/134754 A1  12/2006

OTHER PUBLICATIONS

Jul. 28, 2020 Search Report issued in International Patent Application No. PCT/JP2020/020588.
Dec. 14, 2021 International Preliminary Report on Patentability issued in International Patent Application No. PCT/JP2020/020588.

* cited by examiner

PIEZOELECTRIC ELEMENT

TECHNICAL FIELD

The present disclosure relates to a piezoelectric element.

BACKGROUND ART

Patent Literature 1 discloses a piezoelectric element including a piezoelectric body including a piezoelectric material. In this piezoelectric element, the piezoelectric body includes a base and a plurality of drivers provided on the base in such a way as to be separate from each other. A desired beam pattern of the ultrasonic wave can be obtained by selectively applying a voltage to each driver to excite the ultrasonic wave.

CITATION LIST

Patent Literature

Patent Literature 1: Japanese Unexamined Utility Model (Registration) Application Publication No. S59 (1987)-955

SUMMARY OF INVENTION

Technical Problem

For example, in order to be used as a sensor, a piezoelectric element in which the intensity of an ultrasonic signal is improved is desired.

An aspect of the present disclosure provides a piezoelectric element in which the intensity of the ultrasonic signal is improved.

Solution to Problem

A piezoelectric element according to an aspect of the present disclosure includes a piezoelectric body including a piezoelectric material, and a first electrode and a second electrode provided on the piezoelectric body. The piezoelectric body includes a base and a plurality of drivers. The base includes a first main surface and a second main surface opposing each other. The plurality of drivers is arranged on the first main surface in such a way as to be separate from each other. Each of the plurality of drivers includes a third main surface contacting the first main surface and a fourth main surface opposing the third main surface. The base includes a plurality of first regions in which the plurality of drivers is provided and a second region provided between the first regions adjacent to each other. The base is curved.

In the piezoelectric element, the driver is disposed in the first region of the base of the piezoelectric body. Therefore, when the piezoelectric element is driven, the electric field applied to the driver by the first electrode and the second electrode is uniformly applied to the first region. Accordingly, the displacement of the first region during driving is uniform over the entire first region. On the other hand, the electric field is hardly applied to the first main surface side of the second region. Therefore, the displacement of the second region during driving differs between the first main surface side and the second main surface side. As a result, the second region is bent and vibrated, and the base is bent and vibrated accordingly. Since the base is curved in advance, the displacement of the piezoelectric element is greater than that in the case where the base which is not curved in advance is curved and vibrated. Therefore, the piezoelectric element can improve the intensity of the ultrasonic signal.

A polarization degree in the end portion of the second region on the first main surface side may be different from a polarization degree in the end portion of the second region on the second main surface side. In this case, in the piezoelectric body, since the displacement during driving is greater as the polarization degree is greater, the displacement of the second region at the time of driving is further largely different between the first main surface side and the second main surface side. As a result, since the second region is further largely curved and vibrated, the piezoelectric element can further improve the intensity of the ultrasonic signal.

An interval between end portions on the third main surface side of the drivers adjacent to each other may be different from an interval between end portions on the fourth main surface side of the drivers adjacent to each other. In this case, the driver can be provided perpendicular to the curved base. Further, it is possible to change the balance between the resonance frequencies of the elongation deformation and the bending deformation.

The base may be curved in such a way that the first main surface is projected. In this case, it is easy to arrange the plurality of drivers radially. Therefore, it is possible to prevent the drivers from coining into contact with each other and being damaged.

A polarization degree in an end portion of the second region on the first main surface side may be less than a polarization degree in an end portion of the second region on the second main surface side. In this case, the magnitude of the deformation caused by the polarization process of the piezoelectric body is smaller in the end portion of the second region on the first main surface side than in the end portion of the second region on the second main surface side. Therefore, the base can be easily curved in such a way that that the first main surface is projected.

An interval between end portions on the third main surface side of the drivers adjacent to each other may be smaller than an interval between end portions on the fourth main surface side of the drivers adjacent to each other. In this case, it is possible to prevent the drivers from coining into contact with each other and being damaged.

The first electrode may be provided on the second main surface. The second electrode may include a plurality of electrode portions provided on the fourth main surface of the plurality of drivers. In this case, the displacement of the second region during driving can be easily different between the first main surface side and the second main surface side.

Advantageous Effects of Invention

According to an aspect of the present invention, a piezoelectric element in which the intensity of an ultrasonic signal is improved is provided.

DESCRIPTION OF EMBODIMENTS

Hereinafter, embodiments will be described in detail with reference to the accompanying drawings. In the description, the same reference numerals are used for the same elements or elements having the same functions with redundant description omitted.

Figure 1:
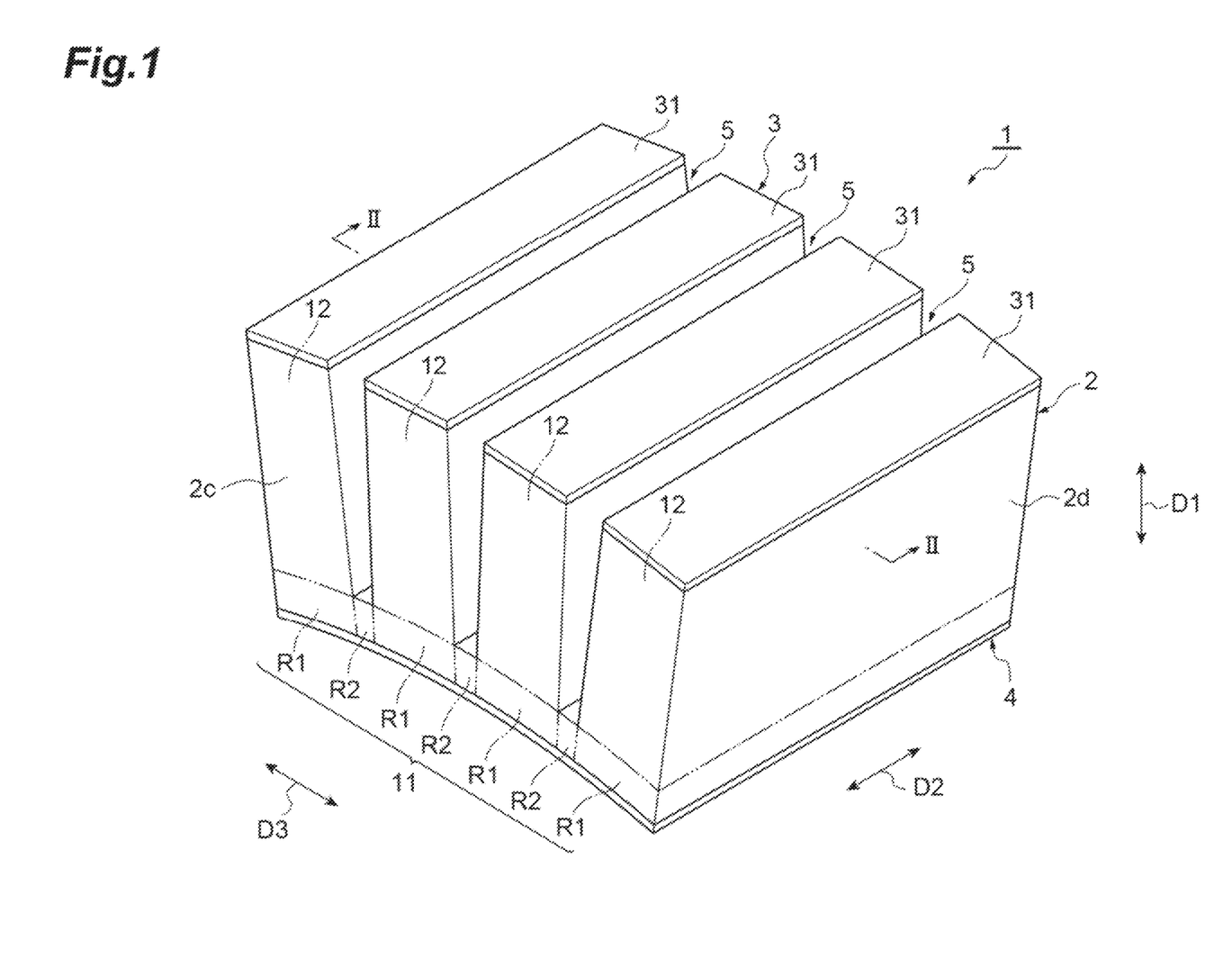
FIG. 1 is a perspective view illustrating a piezoelectric element according to an embodiment.
Figure 2:
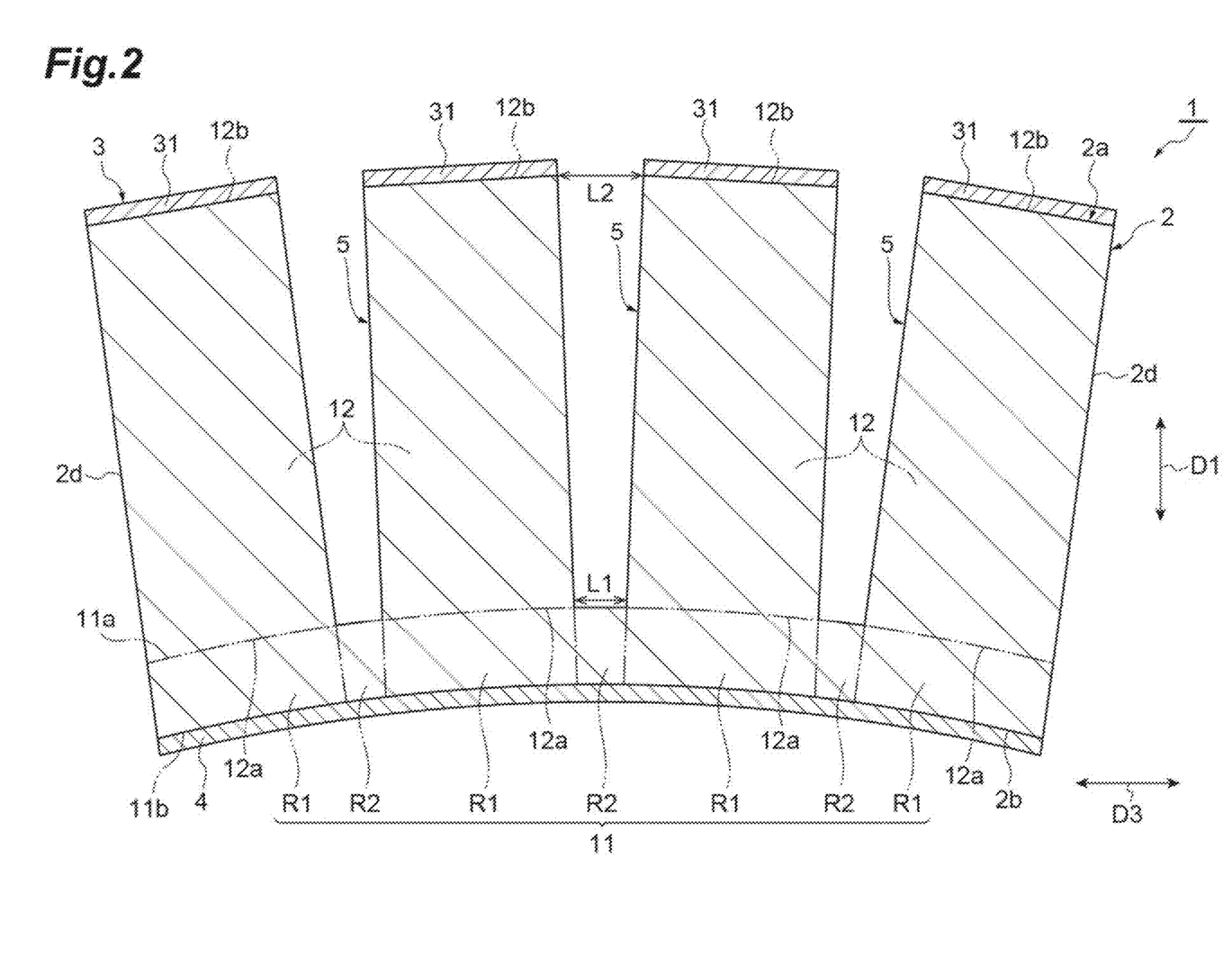
FIG. 2 is a cross-sectional view taken along line II-II in FIG. 1.

FIG. 1 is a perspective view illustrating a piezoelectric element according to an embodiment. FIG. 2 is a cross-sectional view taken along line II-II in FIG. 1. The piezoelectric element 1 shown in FIG. 1 and FIG. 2 is bonded to a diaphragm (not shown) made of a metal plate such as SUS (stainless steel) and used as a sensor. The piezoelectric element 1 is used, for example, as an on-vehicle sensor for detecting the distance between vehicles by transmitting and receiving ultrasonic waves, or as a powder level sensor for detecting the amount of toner in a copying machine. The piezoelectric element 1 includes a piezoelectric body 2, an electrode 3, and an electrode 4.

The piezoelectric body 2 has, for example, a rectangular parallelepiped shape. The rectangular parallelepiped shape includes a rectangular parallelepiped shape in which corner portions and ridge portions are chamfered and a rectangular parallelepiped shape in which corner portions and ridge portions are rounded. The piezoelectric body 2 includes, as its outer surfaces, a main surface 2a and a main surface 2b opposing each other, a pair of side surfaces 2c opposing each other, and a pair of side surfaces 2d opposing each other.

The direction D1 in which the main surface 2a and the main surface 2b oppose each other, the direction D2 in which the pair of side surfaces 2c oppose each other, and the direction D3 in which the pair of side surfaces 2d oppose each other intersect (e.g., are orthogonal to) each other. The main surface 2a and the main surface 2b are curved as described later. Therefore, the opposing direction of the main surface 2a and the main surface 2b may vary according to the positions of the main surface 2a and the main surface 2b. Therefore, the direction D1 may be defined as, for example, a direction in which the center of gravity of the main surface 2a and the center of gravity of the main surface 2b oppose each other, or a direction orthogonal to the directions D2 and D3. The length of the piezoelectric body 2 in the direction D1 is, for example, 3 mm, the length of the piezoelectric body 2 in the direction D2 is, for example, 8 mm, and the length of the piezoelectric body 2 in the direction D3 is, for example, 8 mm.

The piezoelectric body 2 includes a base 11 and a plurality of (four in this example) drivers 12. The base 11 has a main surface 11a and a main surface 11b opposing each other. The direction in which the main surface 11a and the main surface 11b oppose each other coincides with direction D1. The base 11 is curved. The base 11 is curved in such a way that the main surface 11a is projected and the main surface 11b is depressed. The base 11 is curved by, for example, polarization processing described later. The main surface 11a constitutes the main surface 2b.

The plurality of drivers 12 is arranged in such a way as to be separate from each other on the main surface 11a. The plurality of drivers 12 is arranged along direction D3. The driver 12 protrudes from the main surface 11a. The driver 12 includes a main surface 12a in contact with the main surface 11a and a main surface 12b opposing the main surface 12a. The direction in which main surface 12a and main surface 12b oppose each other (that is, the direction in which driver 12 protrudes from main surface 11a) substantially coincides with direction D1 and is orthogonal to main surface 11a. When viewed from the direction D2, the driver 12 is radially provided on the main surface 11a. The main surface 12b of the plurality of drivers 12 constitutes a main surface 2a.

The plurality of drivers 12 is separate from each other via a plurality (three in this embodiment) of slits 5 provided in the piezoelectric element 1. The slits 5 are arranged at equal intervals in the direction D3. The slit 5 divides the main surface 2a. The slit 5 extends in the direction D2 from one side surface 2c to the other side surface 2c. The bottom surface of the slit 5 constitutes a part of the main surface 11a.

The slit 5 is provided to adjust a resonance frequency, an impedance waveform, and the like for sensing when the piezoelectric element 1 is used in a sensor, for example. Specifically, the slit 5 is provided to suppress resonance of the expansion vibration of the driver 12. The expansion vibration of the driver 12 is vibration in the direction D3 of the driver 12. The expansion vibration of the driver 12 is vibration in which the drivers 12 are separate from each other or approach each other by the bending vibration of the base 11. According to the slits 5, the resonance frequency of the expansion vibration of the driver 12 is hardly mixed with the resonance frequency of the vibration of the driver 12 in the vertical direction (direction D1). Therefore, two types of resonance frequencies, that is, the resonance frequency of the vibration of the driver 12 in the vertical direction (direction D1) and the resonance frequency of the expansion vibration of the base 11 are easily used for sensing. Since the slit 5 is not filled with a filler such as silicone, urethane, or epoxy, the resonance of the expansion vibration of the driver 12 can be sufficiently attenuated. Thus, the transmission of the ultrasonic signal is less likely to be inhibited.

The protrusion heights of the drivers 12 from the main surface 11a are equal to each other, for example 2.6 mm. The depths of the slits 5 are equal to each other and correspond to the protrusion heights of the drivers 12 from the main surface 11a. The intervals between the bottom surfaces of the slits 5 and the main surface 2b are equal to each other, for example 0.4 mm. The lengths of the slits 5 in the direction D2 coincides with the length of the piezoelectric body 2 in the direction D2, for example 8 mm.

The interval L1 between the end portions of the adjacent drivers 12 on the main surface 12a side is different from the interval L2 between the end portions of the adjacent drivers 12 on the main surface 12b side. The interval L1 is smaller than the interval L2. The interval L1 is, for example, 150 μm. The interval L2 is, for example, 300 μm. The difference between the interval L1 and the interval L2 is, for example, 150 μm. The interval between the drivers 12 adjacent to each other changes from the end portion of the driver 12 on the main surface 12a side toward the end portion of the driver 12 on the main surface 12b side. The interval between the drivers 12 adjacent to each other is gradually increased from the end portion of the driver 12 on the main surface 12a side toward the end portion of the driver 12 on the main surface 12b side.

The base 11 includes a plurality of (four in this embodiment) first region R1 and one or more (three in this embodiment) second regions R2. A plurality of drivers 12 is arranged on the plurality of first regions R1. The second region R2 is provided between the first regions R1 adjacent to each other. The plurality of first regions R1 and the plurality of second region R2 are alternately arranged in the direction D3. Each of first regions R1 and second regions R2 has a portion of the main surface 11a and a portion of the main surface 11b. The main surface 11a of the second region R2 is the bottom surface of the slit 5.

The piezoelectric body 2 is made of a piezoelectric material. In the present embodiment, the piezoelectric body 2 is made of a piezoelectric ceramic material. Examples of the piezoelectric ceramic material include a material containing lead zirconate titanate (PZT) as a main component and elements such as Nb, Zn, Ni, or Sr added thereto.

Figure 3:
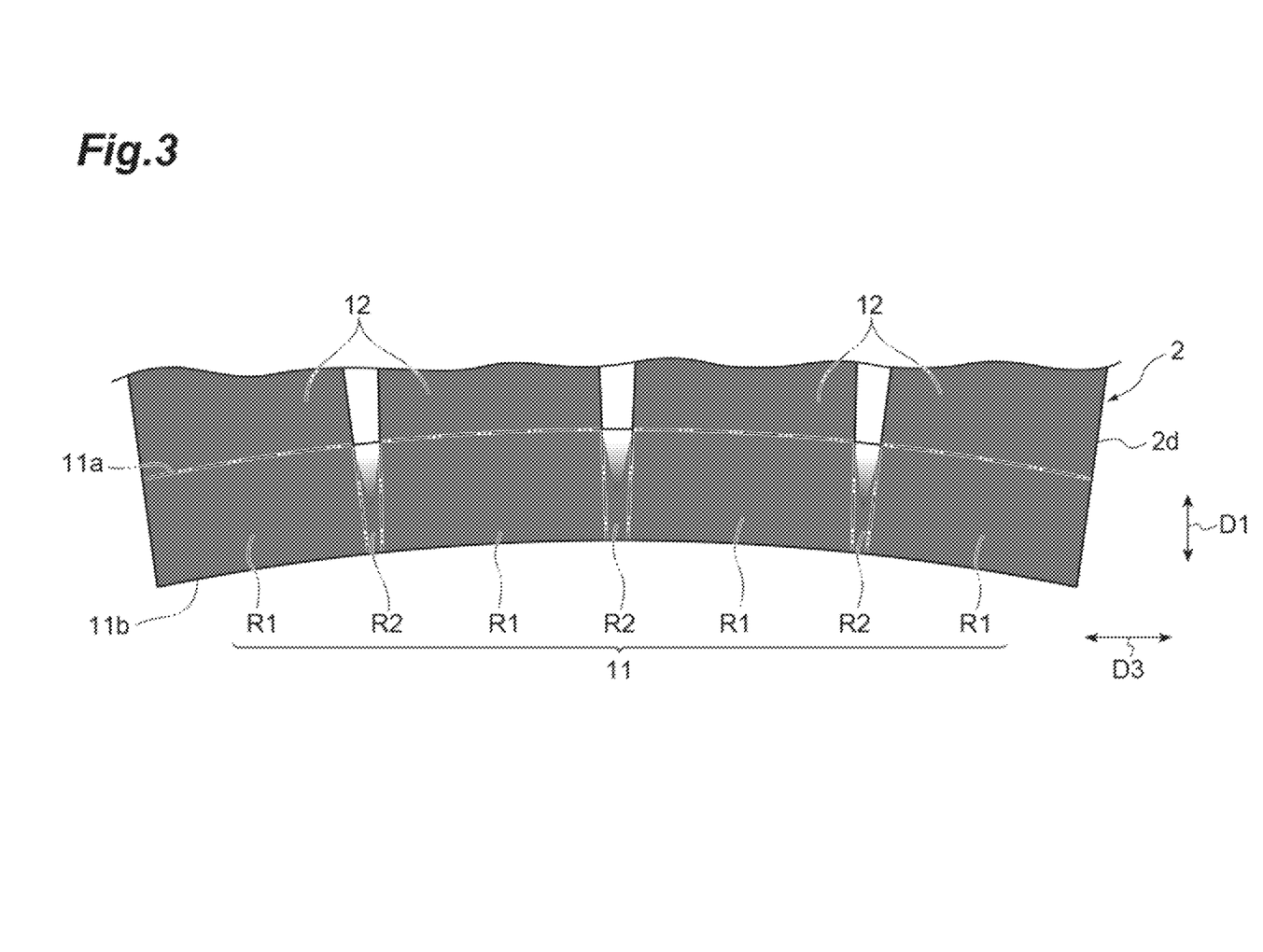
FIG. 3 is a figure showing the polarization degree of the piezoelectric body.

FIG. 3 is a figure showing the polarization degree of the piezoelectric body. The piezoelectric body 2 is polarized in the direction D1. The driver 12 is uniformly polarized throughout the driver 12. That is, the polarization degree (degree of polarization) of the driver 12 is uniform throughout the driver 12. The polarization degree increases as the directions of the spontaneous polarizations in the crystal grains of the piezoelectric ceramic are aligned. In FIG. 3, the higher the polarization degree, the darker the color, and the lower the polarization degree, the lighter the color. In the case of unpolarization, the direction of spontaneous polarization is random, and the polarization degree is low, so that the polarization state is shown in white.

The first region R1 is uniformly polarized throughout the first region R1, and the directions of spontaneous polarizations are aligned. Thus, the polarization degree of the first region R1 is uniform throughout the first region R1. The polarization degree of the first region R1 is equivalent to the polarization degree of the driver 12. In contrast, the polarization degree of the second region R2 differs depending on the position of the second region R2. The polarization degree in the end portion of the second region R2 on the main surface 11a side is different from the polarization degree in the end portion of the second region R2 on the main surface 11b side.

The polarization degree of the end portion of the second region R2 on the main surface 11a side is smaller than the polarization degree of the end portion of the second region R2 on the main surface 11b side. The polarization degree in the end portion of the second region R2 on the main surface 11a side is, for example, equal to that in the case of unpolarization. The polarization degree in the end portion of the second region R2 on the main surface 11b side is equivalent to, for example, the polarization degrees of the driver 12 and the first region R1. The polarization degree of the second region R2 gradually decreases from the main surface 11b toward the main surface 11a.

As shown in FIG. 1 and FIG. 2, the electrodes 3 and 4 are provided on a piezoelectric body 2. The electrode 3 is provided on the main surface 2a. The electrode 3 includes a plurality of (four in this embodiment) electrode portions 31 provided on the main surface 12b of the plurality of drivers 12. The electrode portion 31 covers the entire main surface 12b. The electrode 3 is divided by a plurality of slits 5. The plurality of electrode portions 31 are separate from each other via the slits 5. The electrode 4 is provided on the main surface 2b. The electrode 4 covers the entire main surface 2b.

The electrodes 3 and 4 are made of a conductive material such as Ag. As the conductive material, Pd, an Ag—Pd alloy, Au, Pt, Ni, or the like may be used. The electrodes 3 and 4 are formed by, for example, applying a conductive paste containing a conductive material to the surface of the piezoelectric body 2 and baking the conductive paste. The electrodes 3 and 4 may be formed by a sputtering method, an electroless plating method, or the like. The thicknesses of the electrodes 3 and 4 (lengths in the direction D1) are, for example, equal. The thicknesses of the electrodes 3 and 4 are, for example, 5 µm.

An example of a method of manufacturing the piezoelectric element 1 will be described. First, a piezoelectric ceramic material as a constituent material of the piezoelectric body 2 is processed into granular powder. Subsequently, a polyvinyl binder, water, and the like are added to the powder of the piezoelectric ceramic material to form a piezoelectric ceramic paste. Next, the paste of the piezoelectric ceramic is filled in a mold having a predetermined size, and press-molded. Thus, a ceramic green is obtained. Subsequently, the ceramic green is subjected to debinding treatment. The debinding treatment is performed, for example, by heating the ceramic green placed on a setter made of magnesia or the like. Subsequently, the ceramic green is fired. Thus, a piezoelectric body is obtained. The firing is performed, for example, by placing the ceramic green in a sealed sagger made of magnesia. The firing temperature is, for example, 1200° C. The firing time is, for example, about 2 hours.

Next, the piezoelectric body is polished to a predetermined thickness. Subsequently, a conductive paste is applied to both main surfaces of the piezoelectric body. The conductive paste is formed by adding a binder, a plasticizer, an organic solvent, and the like to powder of a conductive material such as Ag. The conductive paste is applied to the piezoelectric body by screen printing, for example. Subsequently, slit processing is performed on one main surface side of the piezoelectric body. Accordingly, portions corresponding to the base and the plurality of drivers are formed, and the conductive paste provided on the one main surface of the piezoelectric body is divided into a plurality of portions. Thereafter, heat treatment is performed at, for example, about 600° C. to bake the conductive paste. Thus, a piezoelectric element in which the electrode 3 and the electrode 4 are formed is obtained.

Subsequently, the piezoelectric element is subjected to polarization treatment. The polarization treatment is performed, for example, by applying a voltage having an electric field strength of 2 kV/mm to the electrodes 3 and 4 of the piezoelectric element at a temperature of 120° C. for 30 minutes. The polarization treatment is performed, for example, in silicone oil. In this case, since no discharge occurs between the electrode 3 and the electrode 4, the polarization process is easily performed. The silicone oil can be removed from the piezoelectric element by, for example, ultrasonic cleaning using a cleaning agent.

During the polarization process, an electric field in the direction D1 is uniformly applied to the entire portion corresponding to the first region R1 and the driver 12. As a result, the portion corresponding to the first region R1 and the driver 12 is uniformly polarized in the direction D1 over the entirety thereof, and becomes the first region R1 and the driver 12 having a uniform polarization degree. On the other hand, an electric field having a different direction or strength depending on the position is applied to the portion corresponding to the second region R2. As a result, the portion corresponding to the second region R2 is not uniformly polarized, and becomes a second region R2 having a different polarization degree depending on the position. In particular, since almost no electric field is applied to the main surface 11a side, which is the bottom surface of the slit, the main surface 11a side has small polarization degree and becomes substantially unpolarized.

Figure 4:
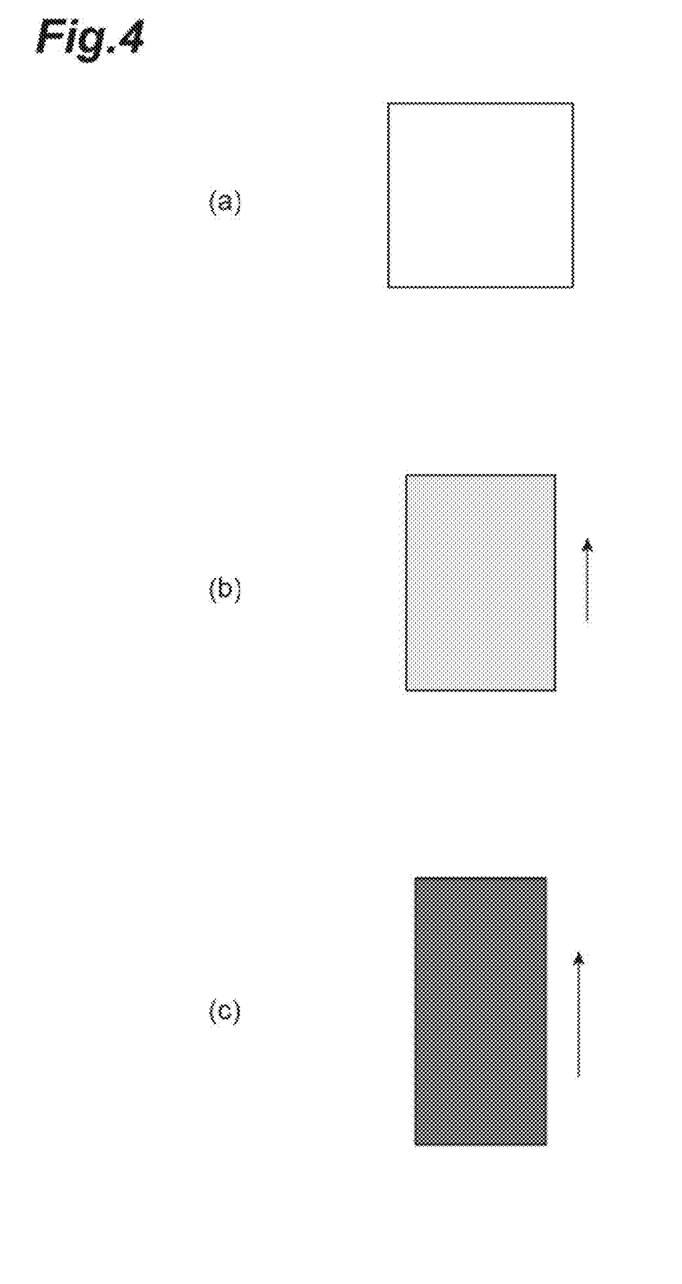
FIG. 4(a), FIG. 4(b), and FIG. 4(c) are schematic views for showing a difference in polarization deformation depending on the polarization degree of the piezoelectric body.

FIG. 4(a), FIG. 4(b), and FIG. 4(c) are schematic views for showing a difference in polarization deformation depending on the polarization degree of the piezoelectric body. In FIG. 4(a), FIG. 4(b), and FIG. 4(c), as in FIG. 3, the higher the polarization degree, the darker the color, and the lower the polarization degree, the lighter the color. In FIG. 4(a), FIG. 4(b), and FIG. 4(c), the polarization degree increases in this order. FIG. 4(a) shows the case of unpolarization. In the piezoelectric body 2, a deformation (polarization deformation) is generated by the above-described polarization process in such a way as to extend in the polarization direction (vertical direction) and contract in the direction orthogonal (horizontal direction) to the polarization direction. Polarization deformation refers to deformation (residual strain) that remains even when the electric field applied to the piezoelectric body 2 is returned to 0. As shown in FIG. 4(a), FIG. 4(b), and FIG. 4(c), in the piezoelectric body 2, the larger the polarization degree is, the larger the polarization deformation is.

The polarization degree in the end portion of the second region R2 on the main surface 11a side (the bottom surface side of the slit 5) is smaller than the polarization degree in the end portion of the second region R2 on the main surface 11b side. Therefore, the polarization deformation in the end portion of the second region R2 on the main surface 11a side is smaller than the polarization deformation in the end portion of the second region R2 on the main surface 11b side. As a result, the base 11 is curved in such a way that the main surface 11a side is projected and the main surface 11b side is depressed particularly in the second region R2.

Figure 5:
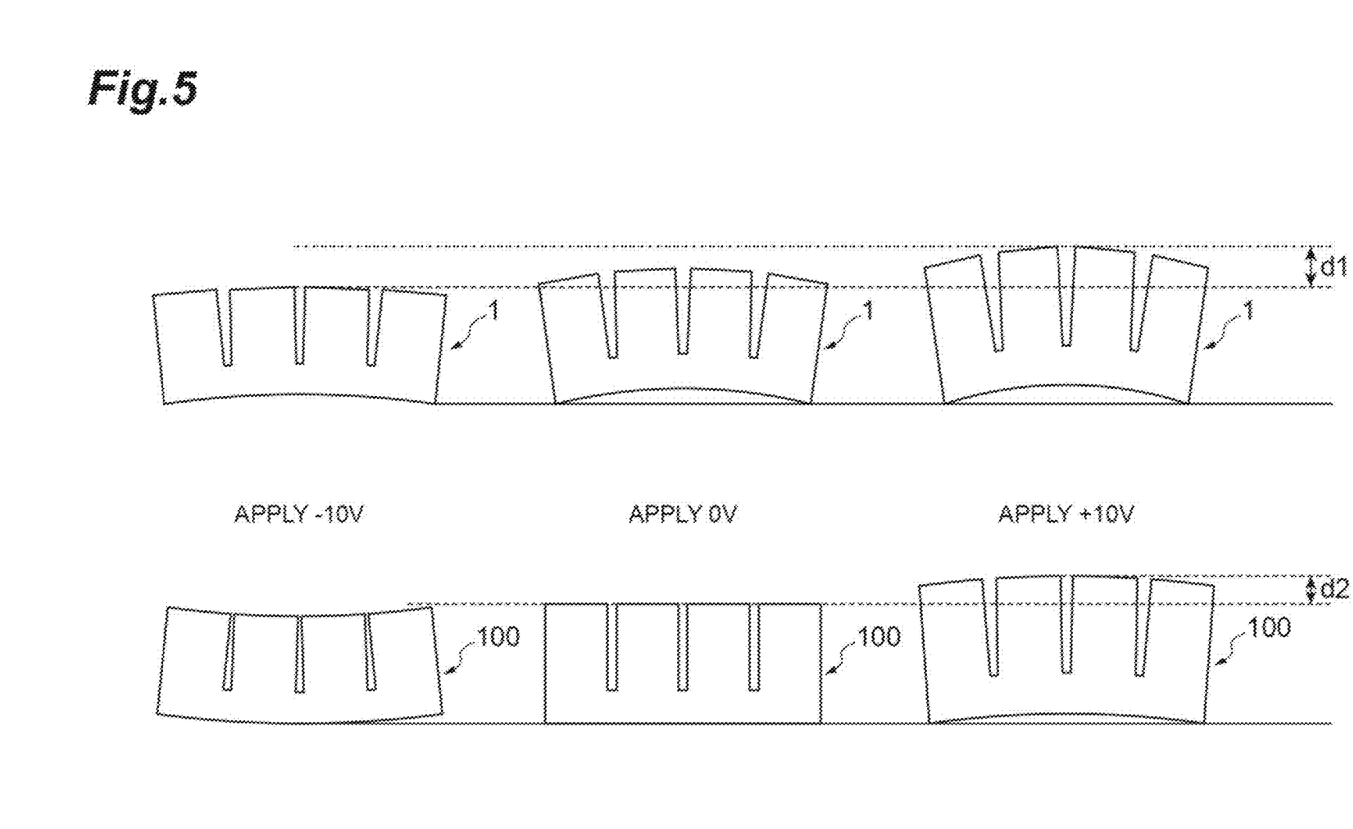
FIG. 5 is a schematic view showing a comparison between the displacement of the piezoelectric element of FIG. 1 and the displacement of a piezoelectric element according to a comparative example.

FIG. 5 is a schematic view showing a comparison between the displacement of the piezoelectric element of FIG. 1 and the displacement of a piezoelectric element according to a comparative example. As shown in FIG. 5, the piezoelectric element 100 according to the comparative example is different from the piezoelectric element 1 in that the base is not curved in a state in which an electric field is not applied (a state in which 0 V is applied). The piezoelectric element 100 is formed, for example, by performing slit processing after polarization processing. In this case, during the polarization process, the electric field is uniformly applied to the portion to be the second region as well as the portion to be the first region and the driver. Therefore, in the piezoelectric body of the comparative example, the polarization degree is uniform over the entire region including the second region. As a result, the base is not curved.

In FIG. 5, a state in which an electric field in a direction opposite to the polarization direction is applied to the piezoelectric element 1 and the piezoelectric element 100 (a state in which −10 V is applied), a state in which no electric field is applied (a state in which 0 V is applied), and a state in which an electric field in the same direction as the polarization direction is applied (a state in which +10 V is applied) are compared. As shown in FIG. 5, in the piezoelectric element 1, since the base 11 (see FIG. 1) is curved in advance, the displacement d1 of the piezoelectric element 1 is greater than the displacement d2 of the piezoelectric element 100 in which the base is not curved in advance. As a result, the intensity of the ultrasonic signal can be improved.

As described above, in the piezoelectric element 1, the driver 12 is disposed in the first region R1 of the base 11 of the piezoelectric body 2. Therefore, when the piezoelectric element 1 is driven, the electric field applied to the driver 12 by the electrodes 3 and 4 is uniformly applied to the first region R1. Accordingly, the displacement of the first region R1 during driving is uniform over the entire first region R1.

On the other hand, since no electrode is disposed on the main surface 11a side of the second region R2, the electric field is hardly applied. Therefore, the displacement of the second region R2 at the time of driving differs between the main surface 11a side and the main surface 11b side. As a result, the second region R2 is bent and vibrated, and the base 11 is bent and vibrated accordingly. In the piezoelectric element 1, the base 11 is curved in advance. Therefore, as described above, the displacement of the piezoelectric element 1 is greater than that of the piezoelectric element 100 in which the base is not curved in advance is curved and vibrated. Therefore, the piezoelectric element 1 can improve the intensity of the ultrasonic signal.

The polarization degree in the end portion of the second region R2 on the main surface 11a side is different from the polarization degree in the end portion of the second region R2 on the main surface 11b side. In the piezoelectric body 2, the larger the polarization degree is, the larger the displacement at the time of driving is. Therefore, the displacement of the second region R2 at the time of driving is greatly different between the main surface 11a side and the main surface 11b side. As a result, since the second region R2 is bent and vibrated more greatly, the piezoelectric element 1 can further improve the intensity of the ultrasonic signal.

The magnitude of the polarization deformation caused by the polarization processing of the piezoelectric body 2 increases as the polarization degree increases. Therefore, since the polarization degree is different between the end portion of the second region R2 on the main surface 11a side and the end portion of the second region R2 on the main surface 11b side, the magnitude of the polarization deformation caused by the polarization process is different. Therefore, the second region R2 is curved by the polarization process, and as a result, the base 11 can be easily brought into a curved state.

The interval L1 is different from the interval L2. Therefore, the driver 12 can be disposed perpendicularly to the curved base 11. Further, it is possible to change the balance between the resonance frequencies of the elongation deformation and the bending deformation. Therefore, optimization according to the frequency and the form to be used is possible.

The base 11 is curved in such a way that the main surface 11a is projected. Therefore, it is easy to arrange the plurality of drivers 12 radially. Therefore, it is possible to prevent the drivers 12 from coining into contact with each other and being damaged.

The polarization degree of the end portion of the second region R2 on the main surface 11a side is smaller than the polarization degree of the end portion of the second region R2 on the main surface 11b side. Therefore, the magnitude of the polarization deformation caused by the polarization treatment of the piezoelectric body 2 is smaller in the end portion of the second region R2 on the main surface 11a side than in the end portion of the second region R2 on the main surface 11b side. Therefore, the base 11 can be easily curved in such a way that the main surface 11a is projected.

The interval L1 is smaller than the interval L2. Therefore, it is possible to prevent the drivers 12 from coining into contact with each other and being damaged.

The electrode 4 is provided on the main surface 11b, and the electrode 3 has a plurality of electrode portions 31 provided on the main surface 12b of the plurality of drivers 12. Therefore, the displacement of the second region R2 at the time of driving can be easily made different between the main surface 11a side and the main surface 11b side.

Although the embodiments of the present invention have been described above, the present invention is not necessarily limited to the above-described embodiments, and various modifications can be made without departing from the scope of the invention.

For example, the base 11 may be curved in such a way that the main surface 11a is depressed and the main surface 11b is projected. The base 11 is curved because the polarization deformation of the second region R2 differs between the main surface 11a side and the main surface 11b side, but may be curved by other ways. Accordingly, the polarization degree of the second region R2 may be uniform throughout the second region R2.

The number of the plurality of drivers 12 and the number of the plurality of first region R1 may be two or more, and the number of the second region R2 and the number of the slits 5 provided in the piezoelectric body 2 may be one. The plurality of drivers 12 may have different shapes, for example. The plurality of first regions R1 may have different shapes, for example. In the method of manufacturing the piezoelectric element 1, the slit process may be performed before the polarization process or after the electrodes 3 and 4 are formed by baking the conductive paste.

REFERENCE SIGNS LIST

1: piezoelectric element, 2: piezoelectric body, 3: electrode (second electrode), 31: electrode portion, 4: electrode (first electrode), 11: base, 11a: main surface (first main surface), 11b: main surface (second main surface), 12: driver, 12a: main surface (third main surface), 12b: main surface (fourth main surface), R1: First region, R2: second region.

The invention claimed is:

1. A piezoelectric element comprising:
a piezoelectric body including a piezoelectric material; and
a first electrode and a second electrode provided on the piezoelectric body,
wherein the piezoelectric body includes:
a base including a first main surface and a second main surface opposing each other; and
a plurality of drivers arranged on the first main surface in such a way as to be separate from each other, each of the plurality of drivers including a third main surface contacting the first main surface and a fourth main surface opposing the third main surface,
wherein the base includes a plurality of first regions in which the plurality of drivers is provided and a second region provided between the first regions adjacent to each other, and
the base is curved,
wherein the second region includes a first end portion close to the first main surface and a second end portion close to the second main surface, and
a polarization degree in the first end portion is different from a polarization degree in the second end portion.

2. The piezoelectric element according to claim 1,
wherein the plurality of drivers includes a pair of drivers adjacent to each other, the pair of drivers including a pair of third end portions close to the third main surface and a pair of fourth end portions close to the fourth main surface, and
an interval between the pair of the third end portions is different from an interval between the pair of the fourth end portions.

3. The piezoelectric element according to claim 1,
wherein the base is curved in such a way that the first main surface is projected.

4. The piezoelectric element according to claim 3,
wherein the plurality of drivers includes a pair of drivers adjacent to each other, the pair of drivers including a pair of third end portions close to the third main surface and a pair of fourth end portions close to the fourth main surface, and
an interval between the pair of third end portions is smaller than an interval between the pair of the fourth end portions.

5. The piezoelectric element according to claim 1,
wherein the first electrode is provided on the second main surface,
the second electrode includes a plurality of electrode portions provided on the fourth main surfaces of the plurality of drivers.

6. The piezoelectric element according to claim 1,
wherein the plurality of drivers is arranged in a single line.

7. A piezoelectric element comprising:
a piezoelectric body including a piezoelectric material; and
a first electrode and a second electrode provided on the piezoelectric body,
wherein the piezoelectric body includes:
a base including a first main surface and a second main surface opposing each other; and
a plurality of drivers arranged on the first main surface in such a way as to be separate from each other, each of the plurality of drivers including a third main surface contacting the first main surface and a fourth main surface opposing the third main surface,
wherein the base includes a plurality of first regions in which the plurality of drivers is provided and a second region provided between the first regions adjacent to each other,
the base is curved in such a way that the first main surface is projected,
the second region includes a first end portion close to the first main surface and a second end portion close to the second main surface, and
a polarization degree in the first end portion is less than a polarization degree in the second end portion.

8. The piezoelectric element according to claim 7,
wherein the plurality of drivers includes a pair of drivers adjacent to each other, the pair of drivers including a pair of third end portions close to the third main surface and a pair of fourth end portions close to the fourth main surface, and
an interval between the pair of the third end portions is different from an interval between the pair of the fourth end portions.

9. The piezoelectric element according to claim 7,
wherein the plurality of drivers includes a pair of drivers adjacent to each other, the pair of drivers including a pair of third end portions close to the third main surface and a pair of fourth end portions close to the fourth main surface, and
an interval between the pair of third end portions is smaller than an interval between the pair of the fourth end portions.

10. The piezoelectric element according to claim 7,
wherein the first electrode is provided on the second main surface, the second electrode includes a plurality of electrode portions provided on the fourth main surfaces of the plurality of drivers.

11. The piezoelectric element according to claim 7, wherein the plurality of drivers is arranged in a single line.

\* \* \* \* \*